US006744298B2

(12) United States Patent
Yamauchi et al.

(10) Patent No.: US 6,744,298 B2
(45) Date of Patent: Jun. 1, 2004

(54) SEMICONDUCTOR DEVICE

(75) Inventors: Tadaaki Yamauchi, Hyogo (JP); Takeo Okamoto, Hyogo (JP); Junko Matsumoto, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/209,906

(22) Filed: Aug. 2, 2002

(65) Prior Publication Data
US 2003/0080787 A1 May 1, 2003

(30) Foreign Application Priority Data

Oct. 29, 2001 (JP) ........................................ 2001-330949

(51) Int. Cl.[7] ................................................ H03L 5/00
(52) U.S. Cl. ........................................ 327/333; 327/108
(58) Field of Search ................................ 327/333, 108, 327/109, 112, 143, 198, 111; 326/80, 81

(56) References Cited

U.S. PATENT DOCUMENTS

| 4,506,164 | A | * | 3/1985 | Higuchi ........................ 326/81 |
| 5,115,434 | A | * | 5/1992 | Aizaki ........................... 326/81 |
| 5,864,244 | A | * | 1/1999 | Kaplinsky ..................... 326/58 |
| 5,912,577 | A | * | 6/1999 | Takagi .......................... 327/333 |
| 6,094,067 | A | * | 7/2000 | Taniguchi ..................... 326/81 |
| 6,351,173 | B1 | * | 2/2002 | Ovens et al. ................. 327/333 |
| 6,445,226 | B2 | * | 9/2002 | Taniguchi ..................... 327/112 |
| 6,501,306 | B1 | * | 12/2002 | Kim et al. .................... 327/112 |

FOREIGN PATENT DOCUMENTS

JP          2001-6369         1/2001

* cited by examiner

*Primary Examiner*—My-Trang Nuton
(74) *Attorney, Agent, or Firm*—McDermott, Will & Emery

(57) ABSTRACT

In the output circuit, at a subsequent stage of a gate circuit operating with a power supply voltage related to a first power supply voltage, a latch circuit formed of an inverter circuit and a MOS transistor is arranged, and is supplied with a second power supply voltage as an operating power supply voltage. An output buffer circuit is driven in accordance with an output signal of the latch circuit. When the first power supply voltage is powered down, the latch circuit receiving and operating with the second power supply voltage holds a signal voltage to be attained in a standby state and thus the output buffer circuit is reliably held in an output high impedance state. In a semiconductor device of a double power supply configuration, even when one power supply is powered down, the output buffer circuit can reliably be set to an output high impedance state.

11 Claims, 6 Drawing Sheets

SEMICONDUCTOR DEVICE

BACKGROUND OF THE INVENTION

1. Field of the Invention

The present invention relates generally to semiconductor devices and particularly to a configuration of an output circuit driving an external bus signal line in response to an internal signal. More specifically, the present invention relates to a configuration of signal output circuitry of a semiconductor device supplied with an output power supply voltage used for outputting a signal and an external power supply voltage used for driving an internal circuit, separately.

2. Description of the Background Art

FIG. 11 schematically shows a configuration of a main portion of a conventional semiconductor device. The semiconductor device 900 includes an internal power supply circuit 901 generating various kinds of internal voltage from an external power supply voltage EXVDD, a memory circuit 902 operating in accordance with the various kinds of internal voltage generated by internal power supply circuit 901, and an output circuit 903 receiving an externally supplied output power supply voltage VDDQ as an operating power supply voltage to buffer data read from memory circuit 902 and externally output the data.

Internal power supply circuit 901 generates an internal power supply voltage used by memory circuit 902 as an operating power supply voltage, an intermediate voltage, a reference voltage and others. For the purpose of simplifying the figure, however, FIG. 11 typically shows a peripheral power supply voltage VDDP generated by internal power supply circuit 901. Normally, external power supply voltage EXVDD is, for example, not lower than 2.5V and output power supply voltage VDDQ is, for example, 1.8V. When external power supply voltage EXVDD is 2.5V, external power supply voltage EXVDD is used as peripheral power supply voltage VDDP. In this case, an array power supply voltage used by a memory cell array included in memory circuit 902 is generated by down-converting external power supply voltage EXVDD. Peripheral power supply voltage VDDP is indicated so as to distinguish peripheral power supply voltage VDDP from external power supply voltage EXVDD in the description.

Memory circuit 902 includes the memory cell array, a row and column select circuit selecting a memory cell of the memory cell array, an internal data read circuit and others.

By applying output power supply voltage VDDQ exclusively to output circuit 903, memory circuit 902 can be stably operated with internal power supply voltage VDDP generated from external power supply voltage EXVDD, even if the output power supply voltage VDDQ varies due to an operation of output circuit 903 consuming output power supply voltage VDDQ. Even when multi-bit data DQ is generated to be transferred, memory circuit 902 can be operated stably without affect due to variation of output power supply voltage VDDQ.

Furthermore, with output power supply voltage VDDQ exclusively supplied to output circuit 903, output circuit 903 can be supplied with an operating power supply voltage with sufficiency, and output circuit 903 can thus be operated in stable manner.

FIG. 12 schematically shows a configuration of a portion of output circuit 903 that is related to outputting of one bit of data. In FIG. 12, output circuit 903 includes an NAND circuit 906 receiving internal read data RD read from an internal read circuit 905 included in memory circuit 902 and an output enable signal OEM, a gate circuit 907 receiving internal read data RD and output enable signal OEM, a level conversion circuit 908 converting the amplitude of a signal output from NAND circuit 906 to the level of output power supply voltage VDDQ, a level conversion circuit 909 converting the amplitude of a signal output from gate circuit 907 to the level of external power supply voltage EXVDD, an inverter circuit 910 inverting a signal output from level conversion circuit 909, and an output buffer circuit 912 driving an output node 920 in response to a signal output from level conversion circuit 908 and a signal output from inverter 910.

Internal read circuit 905 is included in memory circuit 902 shown in FIG. 11, includes a preamplifier circuit and others, and receives peripheral power supply voltage VDDP as an operating power supply voltage and generates internal read data RD having the amplitude of the peripheral power supply voltage VDDP level.

NAND circuit 906 and gate circuit 907 receive peripheral power supply voltage VDDP as an operating power supply voltage. When output enable signal OEM is at a logical low level or L level, NAND circuit 906 outputs a signal of a logical high level or H level. When output enable signal OEM attains an H level, NAND circuit 906 operates as an inverter to invert internal read data RD.

When output enable signal OEM is at L level, gate circuit 907 outputs a signal of the H level and when output enable signal OEM attains the H level, gate circuit 907 operates as a buffer circuit and generates an output signal in accordance with internal read data RD.

Level conversion circuit 908 receives output power supply voltage VDDQ as an operating power supply voltage and level conversion circuit 909 receives external power supply voltage EXVDD as an operating power supply voltage.

Level conversion circuits 908 and 909 simply perform the voltage level (or amplitude) conversion and do not perform conversion in logical level.

Output buffer circuit 912 includes a p-channel MOS transistor (an insulated gate field effect transistor) TP connected between an output power supply node and an output node 920 and having a gate thereof receiving a signal output from level conversion circuit 908, and an n-channel MOS transistor TN connected between output node 920 and a ground node and having a gate thereof receiving a signal output from inverter circuit 910.

When output enable signal OEM is at L level, NAND circuit 906 and gate circuit 907 each output a signal of the H level, and level conversion circuit 908 outputs a signal at the output power supply voltage VDDQ level and level conversion circuit 909 outputs a signal at the external power supply voltage EXVDD level. Inverter 910, receiving external power supply voltage EXVDD as an operating power supply voltage and inverting a signal output from level conversion circuit 909, outputs a signal of the L level.

MOS transistors TP and TN in output buffer circuit 912 are both turned off and thus output buffer circuit 912 attains an output high impedance state.

When output enable signal OEM attains the H level, NAND circuit 906 operates as an inverter, while gate circuit 907 operates as a buffer circuit. When internal read data RD is at H level, NAND circuit 906 outputs a signal of L level and gate circuit 907 outputs a signal of H level. Thus, level conversion circuit 908 outputs a signal of L level and inverter circuit 910 outputs a signal of L level. Thus, MOS transistors TP and TN in output buffer circuit 912 are turned on and off, respectively. In this state, output node 920 is driven to the output power supply voltage VDDQ level via MOS transistor TP.

When internal read data RD is at H level, NAND circuit 906 outputs a signal of H level and gate circuit 907 outputs a signal of L level. In response, inverter 910 outputs a signal of the external power supply voltage EXVDD level and output buffer circuit 912 has MOS transistors TP and TN turned off and on, respectively, and output node 920 is driven via MOS transistor TN to the ground voltage level. By applying a signal of the external power supply voltage level to the gate of MOS transistor TN via inverter circuit 910, the current driving capability of MOS transistor TN is increased to quickly discharge output node 920 to the ground voltage level.

FIG. 13 shows an exemplary configuration of level conversion circuit 908. In FIG. 13, level conversion circuit 908 includes an inverter 908a receiving a signal SIN output from NAND circuit 906, an n-channel MOS transistor 908b connected between an internal node NA and a ground node and having a gate thereof receiving signal SIN output from the NAND circuit, an n-channel MOS transistor 908c connected between an internal node NB and a ground node and having a gate thereof receiving a signal output from inverter 908a, a p-channel MOS transistor 908d connected between an output power supply node and internal node NA and having a gate thereof connected to internal node NB, and a p-channel MOS transistor 908e connected between an output power supply node and internal node NB and having a gate thereof connected to internal node NA. A signal SOUT output from level conversion circuit 908 is generated at internal node NB.

When signal SIN is at H level, MOS transistors 908b and 908c turn on and off, respectively. Thus, internal node NA is discharged via MOS transistor 908b to reduce in voltage level. In response, MOS transistor 908e turns on to charge internal node NB, and internal node NB is increased in voltage level to the output power supply voltage VDDQ level.

When internal node NB attains the output power supply voltage level, MOS transistor 908d turns off. Signal SIN of the peripheral power supply voltage VDDP level is thus converted to signal SOUT of the output power supply voltage VDDQ level.

When signal SIN is at L level, MOS transistors 908b and 908c turn off and on, respectively. In this state, internal node NB is discharged via MOS transistor 908c and is reduced in voltage level. In response, MOS transistor 908d turns on to charge internal node NA to the output power supply voltage VDDP level, and MOS transistor 908e responsively turns off. Thus, in this state, internal node NB outputs the signal SOUT of L level.

As described above, level conversion circuit 908 converts signal SIN of the peripheral power supply voltage VDDP level in amplitude to a signal of the VDDQ level in amplitude and does not perform logical level conversion.

The use of level conversion circuit 908 allows an internal circuit to be driven with the peripheral power supply voltage VDDP level and output buffer circuit 912 to generate a signal of the output power supply voltage level.

Furthermore, if peripheral power supply voltage VDDP is equal to external power supply voltage EXVDD and higher than output power supply voltage VDDQ, a signal applied to output buffer circuit 912 is converted in amplitude to the output power supply voltage level to equalize the rising and falling characteristics of the signal to the output buffer circuit. It is aimed to equalize the rising and falling characteristics in driving the output node by the output buffer circuit 912.

FIG. 14 schematically shows a configuration of a data processing system by way of example. In the processing system shown in FIG. 14, a processing unit 950, a semiconductor memory device 952 storing data used by processing unit 950 and a memory 954 separate from semiconductor memory device 952 are interconnected together through a bus 956.

Processing unit 950 receives power supply voltage VDDL and VDDQ as operating power supply voltages. Semiconductor memory device 952 receives power supply voltage EXVDD and VDDQ as operating power supply voltages. Memory 954 receives power supply voltage VDDL as an operating power supply voltage. When processing unit 950 transmits data to semiconductor memory device 952 through bus 956, processing unit 950 transfers a signal in accordance with output power supply voltage VDDQ to adapt the signal interface with semiconductor memory device 952.

In such a data processing system, if no access is made to semiconductor memory device 952 for a long period of time, processing unit 950 stops supplying external power supply voltage EXVDD at least to semiconductor memory device 952, via a power supply management unit (not shown). Processing unit 950 uses data stored in memory 954 to execute a processing.

As data/a signal is transferred between memory 954 and processing unit 950 through bus 956, output buffer circuit 912 shown in FIG. 12 is required to maintain an output high impedance state even when semiconductor memory device 952 is stopped of supplying external power supply voltage EXVDD while being supplied with output power supply voltage VDDQ. A MOS transistor turns off when its gate to source voltage goes below a threshold voltage in absolute value. Thus, for example in the configuration of FIG. 13, if peripheral power supply voltage VDDP generated from external power supply voltage EXVDD drops in level in response to stopping of supplying external power supply voltage EXVDD, there may be caused a case where the signal SIN set to H level in a standby state thereof is not discharged to the ground voltage level and the signal SIN is held at an intermediate voltage level. Similarly, the output signal from the inverter 908a might be held at an intermediate voltage level.

In this case, if level conversion circuit 908 has MOS transistors 908b and 908c both turned on or both turned off, internal nodes NA and NB has voltage at an uncertain level, and level conversion circuit 908 outputs an signal SOUT that is not held at output power supply voltage VDDQ level but at an intermediate voltage level. If such state is caused, MOS transistor TP in output buffer circuit 912 would possibly supply a current to output node 920.

Similarly also in the arrangement of FIG. 12, if supplying of external power supply voltage EXVDD is stopped, the output signal of inverter 910 could not discharged fully to the ground voltage level, and level conversion circuit 909 would have the output signal floating in level to an intermediate voltage level. In response, inverter 910 enters a state of outputting a signal held at an intermediate voltage level and the discharging MOS transistor TN turns conductive. Thus, in this state also, output buffer circuit 912 has MOS transistor TN turned conductive and drives output node 920 towards the ground voltage level, and output buffer circuit 912 thus does not enter the output high impedance state.

In semiconductor memory unit 952, if output buffer circuit 912 is set into a state different from the output high impedance state, a signal/data transferred in between memory 954 and processing unit 950 would be adversely affected by data outputted from output buffer circuit 912, and thus, a signal/data can not be transferred accurately.

The following state is considered. Processing unit 950 and semiconductor memory device 952 are interconnected together via bus 956 and processing unit 950 is interconnected to memory 954 via a different bus. In addition, the bus interconnecting processing unit 950 and semiconductor memory device 952 has a signal line terminated to a voltage different in level from output power supply voltage VDDQ. Even in such state, if output buffer circuit 912 is set to a state different from the output high impedance state, a current would flow between output buffer circuit 912 and a terminating power source and current consumption thus disadvantageously increases.

SUMMARY OF THE INVENTION

An object of the present invention is to provide a semiconductor memory device having an output buffer circuit reliably is held at an output high impedance state even if an output power supply voltage is interrupted while an output power supply voltage is supplied.

A semiconductor device according to a first aspect of the present invention includes: a first output drive signal generation circuit receiving a first power supply voltage as an operating power supply voltage and for generating a first output drive signal in response at least to an internal signal; a first latch circuit receiving a second power supply voltage as an operating power supply voltage and latching and transferring the first output drive signal; and a first output transistor receiving the second power supply voltage as an operating power supply voltage and in response to a signal output from the first latch circuit for driving an output node.

A semiconductor device according to a second aspect of the present invention includes first circuitry receiving a first power supply voltage as an operating power supply voltage thereof and generating a first signal in accordance with a received signal, and second circuitry receiving a second power supply voltage as an operating power supply voltage thereof and generating a second signal in accordance with the first signal. The second circuitry includes a latch circuit receiving the first signal at an input and latching a signal voltage at the input.

According to the arrangement of the present invention, the latch circuit is provided which receives the second power supply voltage as the operating power supply voltage and the output transistor or an output driving circuit is driven in accordance with the output signal of the latch circuit. Even if supplying of the first power supply voltage is interrupted, the latch circuit latches the state of the signal immediately before the interruption of supply of the first power supply voltage. Thus, the output transistor or the output driving circuit can be held in the state immediately before the interruption of the first power supply voltage to hold the output high impedance state. Accordingly, the output circuit can be reliably held in the output high impedance state upon interruption of the supply of the first power supply voltage, to prevent the collision of a signal/data on an external bus from occurring.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
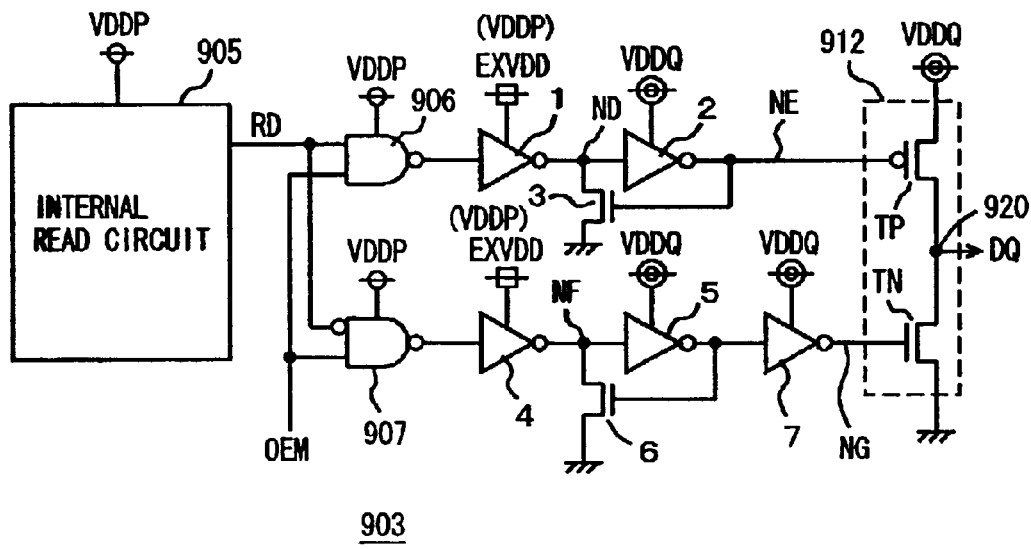
FIG. 1 shows a configuration of an output circuit in accordance with a first embodiment of the present invention.

Referring to FIG. 1, output circuit 903 includes an inverter circuit 1 receiving a signal output from an NAND circuit 906, an inverter circuit 2 receiving a signal output from inverter circuit 1, an n-channel MOS transistor 3 rendered conductive in response to a signal being H level outputted from inverter circuit 2 to drive an input node ND of inverter circuit 2 to a ground voltage level, an inverter circuit 4 receiving a signal output from a gate circuit 907, an inverter circuit 5 receiving a signal output from inverter circuit 4, an n-channel MOS transistor 6 rendered conductive in response to a signal being H level output from inverter circuit 5 to hold a node NF at the ground voltage level, an inverter circuit 7 receiving a signal output from inverter circuit 6, and an output buffer circuit 912 for driving an output node 920 in response to the signals output from inverter circuits 2 and 7.

NAND circuit 906 receives peripheral power supply voltage VDDP as an operating power supply voltage, and receives internal read data RD from internal read circuit 905 and read enable signal OEM as input signals.

Gate circuit 907 receives internal read data RD and read enable signal OEM as input signals and receives peripheral power supply voltage VDDP as an operating power supply voltage.

Peripheral power supply voltage VDDP may be at the same voltage level as external power supply voltage EXVDD, or may be generated by down-converting external power supply voltage EXVDD. The embodiment shown in FIG. 1 will be described with the assumption that peripheral power supply voltage VDDP is generated by down-converting external power supply voltage EXVDD.

An output signal of inverter circuit 2 is applied to a gate of a p-channel MOS transistor TP in output buffer circuit 912, and an output signal of inverter circuit 7 is applied to a gate of an n-channel MOS transistor TN in output buffer circuit 912.

Inverter circuits 1 and 4 receive external power supply voltage EXVDD as an operating power supply voltage and invert the signals output from NAND circuit 906 and gate circuit 907, respectively. If peripheral power supply voltage VDDP is at a voltage level different from external power supply voltage EXVDD, inverter circuits 1 and 4 would have a level conversion function or a level conversion circuit is arranged in each respective preceding stage.

It should be noted that inverter circuits 1 and 4 may receive peripheral power supply voltage VDDP as an operating power supply voltage. In the following description, an indefinite state of an internal signal, when supplying of external power supply voltage EXVDD is interrupted, is described. Therefore, inverter circuits 1 and 4 are shown receiving external power supply voltage EXVDD as an operating power supply voltage, in order to describe the stabilization of a signal at a boundary portion of a circuit receiving as an operating power supply voltage an internal power supply voltage corresponding to the external power supply voltage and a circuit receiving output power supply voltage VDDQ as an operating voltage.

Inverter circuits 2, 5 and 7 receive output power supply voltage VDDQ as an operating power supply voltage. Internal read circuit 905 receives peripheral power supply voltage VDDP as an operating power supply voltage.

Figure 2:
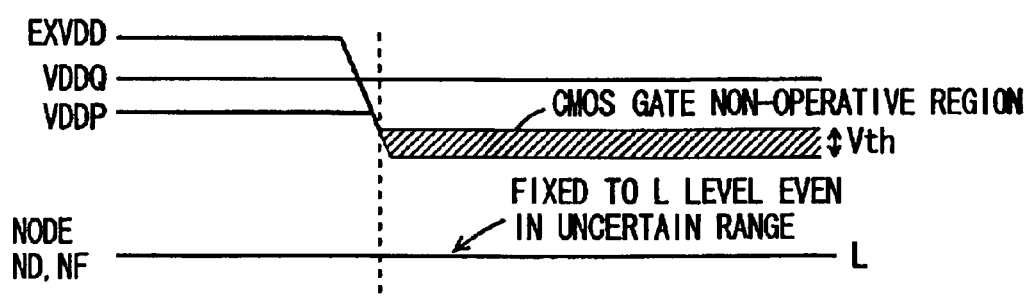
FIG. 2 is a signal waveform diagram representing an operation of the output circuit shown in FIG. 1.

Now, a case as shown in FIG. 2 is considered in which supplying of external power supply voltage EXVDD is interrupted while output power supply voltage VDDQ is being supplied. Interruption of supply of external power supply voltage EXVDD is done when the semiconductor memory device is in a standby state.

Peripheral power supply voltage VDDP is generated from external power supply voltage EXVDD. Thus, when supplying of external power supply voltage EXVDD is interrupted, peripheral power supply voltage VDDP responsively drops in level. When the peripheral power supply voltage VDDP reduces to a level of a threshold voltage of a MOS transistor of a component or so, a circuit receiving peripheral power supply voltage VDDP as an operating power supply voltage enters an inoperable state, and a peripheral circuit outputting internal read data RD, output enable signal OEM and the like outputs a signal of an uncertain voltage level. For example, in NAND circuits 906 and 907, when an input signal attains a voltage level of a threshold value of an n-channel MOS transistor of a component thereof, the n-channel MOS transistor in a conductive state receives at its gate a signal at a voltage level equal to or near the level of the threshold voltage, and the n-channel MOS transistor in the conductive state turns non-conductive. Thus, the output signal of NAND circuit 906 and gate circuit 907 turn into an uncertain state.

In response to the output signal of the uncertain state, inverter circuits 1 and 4 receiving external power supply voltage EXVDD as an operating power supply voltage similarly receive an output signals of an uncertain voltage level.

In a standby state, inverter circuit 2 and MOS transistor 3 in cooperation hold output node ND of inverter circuit 1 at the ground voltage level and inverter circuit 5 and MOS transistor 6 in cooperation hold output node NF of inverter circuit 4 at L level. In this state, even if supplying of external power supply voltage EXVDD is interrupted and the input nodes of inverter circuits 1 and 4 have the voltages in an uncertain state, output power supply voltage VDDQ is still supplied and inverter 2 and MOS transistor 3 operate to hold node ND at the ground voltage level and inverter circuit 5 and MOS transistor 6 operate to hold node NF at the ground voltage level. Thus, if supplying of external power supply voltage EXVDD is interrupted and NAND circuit 906, inverter circuit 1, gate circuit 907 and inverter circuit 4 enter an inoperable state, internal nodes ND and NF can still be held at the ground voltage level.

In this state, output node NE of inverter circuit 2 is at a voltage of H level and output node NG of inverter circuit 7 receiving a signal output from inverter circuit 5 is kept at a voltage of L level, output buffer circuit 912 has MOS transistors TP and TN both kept in non-conductive state, and output buffer circuit 912 can still be held in an output high impedance state when supplying of external power supply voltage EXVDD is interrupted.

It should be noted that in FIG. 1, inverter circuits 1 and 4 may be inverter circuits with a level conversion function generating a signal of an amplitude of the output power supply voltage VDDQ level. In this configuration as well, when NAND circuit 906 and gate circuit 907 output signals of an uncertain state, the level conversion circuits receive the signal in an uncertain state and output a signal in an uncertain state. In this case also, through the use of the latch circuit formed of a subsequent inverter and MOS transistor to hold an output node of the level conversion circuit at a voltage level of the standby state, the output buffer circuit can be reliably set to the output high impedance state when supplying of external power supply voltage EXVDD is interrupted.

Furthermore, if inverter circuits 1 and 4 receive peripheral power supply voltage VDDP as an operating power supply voltage, peripheral power supply voltage VDDP is a down-converted voltage of the external power supply voltage, and a similar function and effect can be obtained.

First Modification

Figure 3:
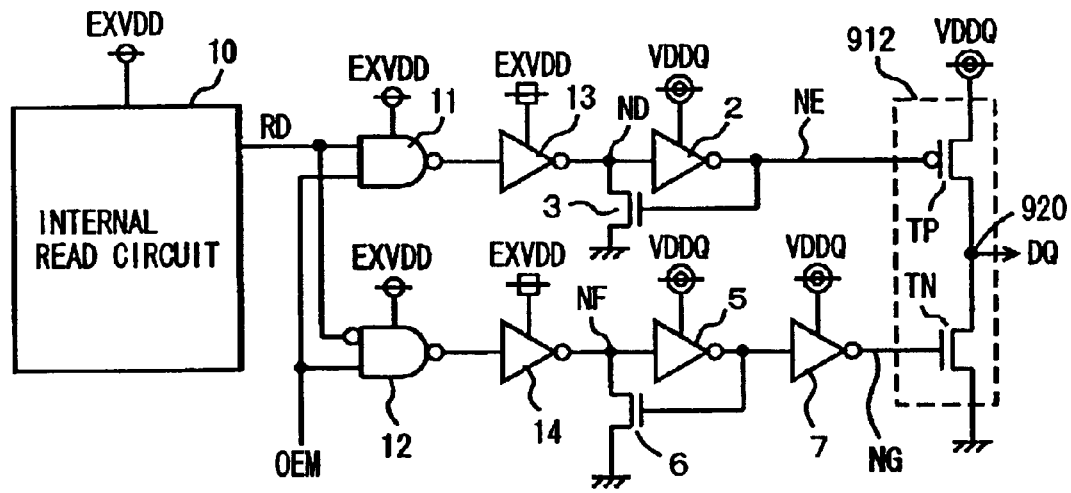
FIG. 3 shows a configuration of the output circuit of a modification of the first embodiment according to the present invention.

FIG. 3 schematically shows a configuration of a first modification of the first embodiment of the present invention. In the configuration shown in FIG. 3, external power supply voltage EXVDD is supplied as an operating power supply voltage for operating a peripheral circuit. Here, a profile of power supply voltages supplied when external power supply voltage EXVDD is supplied as peripheral power supply voltage VDDP, is indicated for confirmation. For example, if external power supply voltage EXVDD is 2.5V and output power supply voltage VDDQ is 1.8V, external power supply voltage EXVDD is applied to the peripheral circuit as an operating power supply voltage.

An internal read circuit 10 receives external power supply voltage EXVDD as an operating power supply voltage and generates internal read data RD of the external power supply voltage EXVDD level. An NAND circuit 11 receiving output enable signal OEM and internal read data RD also receives external power supply voltage EXVDD as its operating power supply voltage. A gate circuit 12 receiving external read data RD and output enable signal OEM also receives external power supply voltage EXVDD as an operating power supply voltage. An inverter circuit 13 receiving a signal outputted from NAND circuit 11 receives external power supply voltage EXVDD as an operating power supply voltage and an inverter circuit 14 receiving a signal outputted from gate circuit 12 also receives external power supply voltage EXVDD as an operating power supply voltage. In this case, inverter circuits 13 and 14 do not have a level conversion function. The remaining configuration of the output circuit 903 shown in FIG. 3 is identical to that of the output circuit 903 shown in FIG. 1, and like components are denoted by like reference numerals and the description thereof will not be repeated.

As shown in FIG. 3, when the supply of external power supply voltage EXVDD supplied as an operating power supply voltage for an internal circuit is interrupted and inverter circuits 13 and 14 output signals of an uncertain state, inverter circuit 2 and MOS transistor 3 in cooperation hold the node ND at a voltage level in the standby state, or the ground voltage level, and inverter circuit 5 and MOS transistor 6 in cooperation hold the node NF at a voltage level in the standby state, as in the configuration shown in FIG. 1.

Thus, if external power supply voltage EXVDD is used as an operating power supply voltage for an internal circuit, a latch circuit fanned of inverter circuit 2 and MOS transistor 3 and a latch circuit formed of inverter circuit 5 and MOS transistor 6 that are provided at the respective outputs of the circuits 13 and 14 receiving external power supply voltage EXVDD as an operating power supply voltage reliably hold output buffer circuit 912 in the output high impedance state when supplying of external power supply voltage EXVDD is interrupted while output power supply voltage VDDQ is being supplied.

As described so far, according to the first embodiment, a latch circuit receiving an output power supply voltage as an operating power supply voltage is arranged at an output stage of a circuit receiving as an operating power supply voltage a power supply voltage related to an external power supply voltage. Thus, an output buffer circuit can be reliably held in an output high impedance state when supplying of the external power supply voltage is interrupted while the output power supply voltage is being supplied.

Second Embodiment

Figure 4:
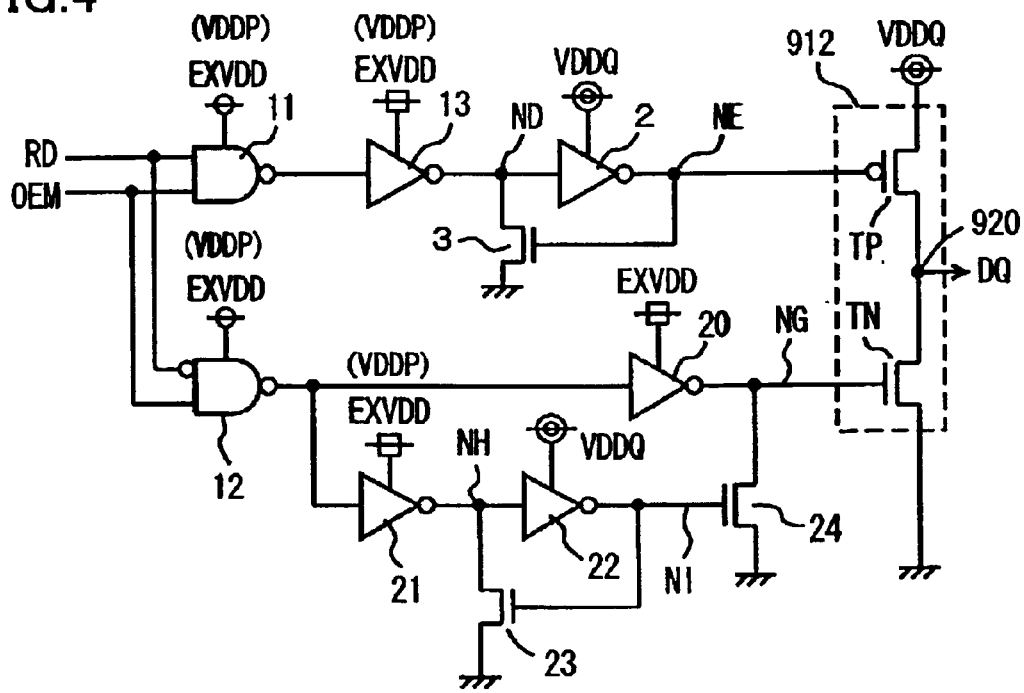
FIG. 4 shows a configuration of the output circuit according to a second embodiment of the present invention.

FIG. 4 shows a configuration of the output circuit according to a second embodiment of the present invention. In FIG. 4, external power supply voltage EXVDD is used as a peripheral power supply voltage operating an internal circuit.

In order to drive p-channel MOS transistor TP of output buffer circuit 912, there are provided NAND circuit 11 receiving internal read data RD and output enable signal OEM, inverter circuit 13 receiving a signal output from NAND circuit 11, and inverter circuit 2 receiving a signal output from inverter circuit 13. N-channel MOS transistor 3 is provided to hold input node ND of inverter circuit 2 at the ground voltage level in response to a signal output from inverter circuit 2. P-channel MOS transistor TP shown in FIG. 4 is driven by the circuitry of a configuration identical to that shown in FIG. 3.

To drive n-channel MOS transistor TN included in output buffer circuit 912, there are provided gate circuit 12 receiving internal read data RD and output enable signal OEM, and an inverter circuit 20 driving the gate of MOS transistor TN in response to a signal output from gate circuit 12. Inverter circuit 20 receives external power supply voltage EXVDD as an operating power supply voltage. By setting the gate voltage of output MOS transistor TN at external power supply voltage EXVDD level to render MOS transistor TN conductive, the current driving capability of MOS transistor TN is increased to quickly discharge the output node.

To drive n-channel MOS transistor TN, there are also provided an inverter circuit 21 receiving a signal output from gate circuit 12, an inverter circuit 22 receiving a signal output from inverter circuit 21, an n-channel MOS transistor 24 operative in response to signal output from inverter circuit 22 to drive an output node NG of inverter circuit 20 to the ground voltage level, and an n-channel MOS transistor 23 operative in response to a signal output from inverter circuit 22 to hold an input node NH of inverter circuit 22 at the ground voltage level.

In the configuration shown in FIG. 4, inverter circuit 2 and MOS transistor 3 form a latch circuit. If supplying of external power supply voltage EXVDD is interrupted in the standby state, inverter circuit 2 and MOS transistor 3 hold output node NE of inverter circuit 2 at the output power supply voltage VDDQ level, as in the first embodiment.

Gate circuit 12 and inverter circuits 20 and 21 receive external power supply voltage EXVDD as each operating power supply voltage and inverter circuit 22 receives output power supply voltage VDDQ as an operating power supply voltage. Therefore, if supplying of external power supply voltage EXVDD is interrupted, inverter circuit 22 and MOS transistor 23 hold input node NH of inverter circuit 22 at the ground voltage level and output node NI of inverter circuit 22 at the output power supply voltage VDDQ level. Thus, MOS transistor 24 maintains a conductive state, node NG is held at the ground voltage level regardless of the state of the output signal from inverter circuit 20, and output buffer circuit 912 has MOS transistor TN reliably maintained in a non-conductive state.

In the configuration of FIG. 4, the latch circuit receiving output power supply voltage VDDQ as an operating power supply voltage is arranged at an output of inverter circuit 21 receiving external power supply voltage EXVDD as an operating power supply voltage, and therefore, output buffer circuit 912 can have p- and n-channel MOS transistors TP and TN both held in a non-conductive state to set output node 920 in the output high impedance state.

It should be noted that in the configuration described above, peripheral power supply voltage VDDP may be generated from external power supply voltage EXVDD and used by the peripheral circuit as an operating power supply voltage, as in the configuration shown in FIG. 1. In the configuration using peripheral power supply voltage VDDP as an operating power supply voltage, the circuits except inverter circuit 20 in the arrangement shown in FIG. 4. are supplied with peripheral power supply voltage VDDP in place of external power supply voltage EXVDD, although inverter circuits 13, 20 and 21 are each formed of an inverter having a level conversion function.

In the configuration generating peripheral power supply voltage VDDP by down-converting an external power supply voltage, the peripheral power supply voltage is generated from external power supply voltage EXVDD, and therefore, similarly by means of a latch circuit, a signal having a possibility of entering an uncertain or indefinite state can be held to be a signal in a definite state.

As described so far, according to the second embodiment, in the configuration in which the gate of the MOS transistor discharging an output node to the ground voltage level is driven by a signal of an amplitude of the external power supply voltage EXVDD level, a latch circuit receiving an output power supply voltage as an operating power supply voltage is arranged in a path driving the gate of the output node discharging MOS transistor TN to the ground voltage level, and thus, the discharging MOS transistor can be reliably held in a non-conductive state to set the output circuit in the output high impedance state when supplying of external power supply voltage EXVDD is interrupted.

Third Embodiment

Figure 5:
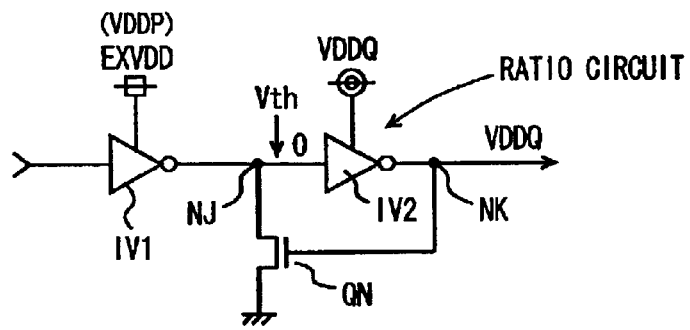
FIG. 5 schematically shows a configuration of a main portion of the output circuit according to a third embodiment of the present invention.

FIG. 5 schematically shows a configuration of the latch circuit in accordance with a third embodiment of the present invention. The latch circuit shown in FIG. 5 latches a signal output from an inverter IV1 receiving external power supply voltage EXVDD as an operating power supply voltage. This latch circuit includes an inverter circuit IV2 receiving output power supply voltage VDDQ as an operating power supply voltage and inverting a signal output from inverter IV1, and an n-channel MOS transistor QN operative in response to a signal output from inverter circuit IV2 to drive an input node NJ of inverter circuit IV2 to the ground voltage level. Inverter circuit IV2 and n-channel MOS transistor QN generically represent the latch circuits shown in FIGS. 1 to 3.

The preceding inverter circuit IV1 and a circuit at a stage preceding the inverter circuit IV1 each receive external power supply voltage EXVDD as an operating power supply voltage. When external power supply voltage EXVDD drops to the level of a threshold voltage Vth of an n-channel MOS transistor, a circuit portion receiving external power supply voltage EXVDD as an operating power supply voltage enters a non-operative state. More specifically, in a CMOS circuit, if the operating power supply voltage does not rise beyond a threshold voltage of MOS transistor of a component, a path for flowing an operating current is not formed and the circuit cannot operate.

For example, when a CMOS inverter circuit outputs a signal of H level and power supply is shut off, a discharging n-channel MOS transistor thereof is in a non-conductive state and does not effect a discharging operation, whereas in this state, the p-channel MOS transistor turns non-conductive when the gate-source voltage thereof attains its threshold voltage. The output signal, dropping in voltage level in accordance with the power supply voltage level, does not drops below an absolute value of the threshold voltage of the p-channel MOS transistor.

Furthermore, if power supply is shut off with the CMOS inverter circuit outputting a signal of L level and the input signal to the CMOS inverter drops in voltage faster than an operating power supply voltage drops in voltage, the p-channel MOS transistor turns conductive to increase the voltage level of the output signal, while the n-channel MOS transistor turns non-conductive in accordance with the input signal. Thus, the increased voltage of the output signal cannot be discharged. Furthermore, even if the p-channel MOS transistor has a gate-source voltage to attain its threshold voltage in absolute value and turns off, the output signal could not falls as the drop of the operating power supply voltage since the output signal is isolated from the operating power supply, and therefore, the output signal has the voltage level kept in an increased level.

Thus, from the relationship between the rate at which power supply voltage EXVDD drops and that at which the input/output signal of inverter IV1 changes, it is possible that the output signal of inverter circuit IV1 attains a level of an absolute value of threshold voltage (referred to as threshold voltage), Vth, of a MOS transistor of a component at the maximum. Inverter circuit IV2 is formed of a ratio circuit and has the P and N MOS transistors of the components adjusted in size (βratio), so as to output a signal at output power supply voltage VDDQ even if the output node NJ of inverter IV1 attains a voltage level of the threshold voltage Vth level.

Figure 6:
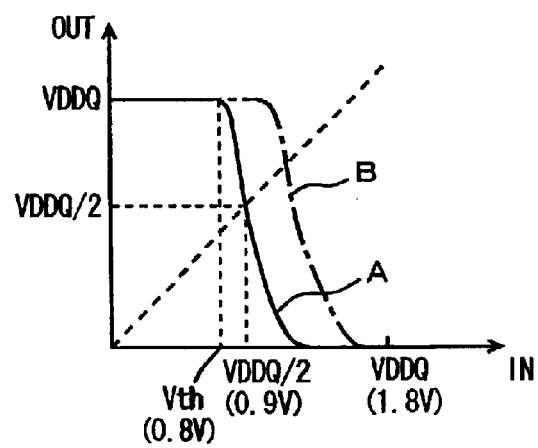
FIG. 6 schematically shows input and output characteristics of an inverter circuit shown in FIG. 5.

In other words, as shown in FIG. 6, typically a CMOS inverter circuit has a logical input threshold value set to half a voltage level of an operating power supply voltage and is formed of a ratioless circuit in many cases. In this case, if output power supply voltage VDDQ is 1.8V, a logical input threshold value assumes VDDQ/2 or 0.9V. If the threshold voltage Vth is 0.8V and when the input signal IN slightly exceeds the threshold voltage Vth level, as indicated in FIG. 6 by a curve A, the output signal OUT drops rapidly in voltage level. For example, if in response to a signal outputted from inverter circuit IV1, the output signal of inverter IV2 rapidly drops, for example, to half the voltage level of output power supply voltage VDDQ, the output signal of inverter circuit IV2 lowers to a voltage level close to a threshold voltage of n-channel MOS transistor QN, MOS transistor Q2 is insufficiently rendered conductive, and there may be a case that node NJ could not be held at the ground voltage level.

Furthermore, when node NJ is held at such an intermediate voltage level, inverter circuit IV2 flows through-current. Accordingly, inverter circuit IV2 is formed of a ratio circuit to set the logical input threshold voltage thereof high to ensure that the voltage at the output power supply voltage VDDQ level is output even if an input signal (or the voltage of a signal at node NJ) is at the threshold voltage Vth level, as indicated in FIG. 6 by a curve B.

In general, logical input threshold voltage VT and the size of a MOS transistor of a component are related as represented in the following expression:

$$VT = \frac{\left(\frac{Vthn}{VDD}\right) + \sqrt{\frac{\beta P}{\beta N}}\left(1 - \frac{|Vthp|}{VDD}\right)}{1 + \sqrt{\frac{\beta P}{\beta N}}} \cdot VDD,$$

wherein Vthn and Vthp represent a threshold voltage of the n-channel MOS transistor and that of the p-channel MOS transistor, respectively, and βP and βN are coefficients determined by sizes (or channel width-to-channel length ratios W/L) of the p- and n-channel MOS transistors, respectively.

Since the coefficient βP is determined by the ratio of the channel width to channel length of the p-channel MOS transistor and the coefficient βN is determined by the ratio of the channel width to channel length of the n-channel MOS transistor, the p- and n-channel MOS transistors are adjusted in size to set the logical input threshold voltage to be higher than typical. Thus, if a circuit receiving external power supply voltage EXVDD at a preceding stage is made non-operable and the voltage level at node NJ increases, inverter circuit IV2 can still output a signal set to the output power supply voltage VDDQ level and MOS transistor QN can in response be kept conductive to hold node NJ at the ground voltage level.

It should be noted that the inverter IV1 shown in FIG. 5 receives external power supply voltage EXVDD as an operating power supply voltage thereof. However, inverter IV1 may receive peripheral power supply voltage VDDP as an operating power supply voltage thereof, although a level conversion circuit needs to be arranged at a subsequent stage of inverter IV1.

As described so far, according to the third embodiment, an inverter circuit in a latch circuit receiving an output power supply voltage as an operating power supply voltage is formed of a ratio circuit and is made to have an input logic threshold voltage such that an input signal at a voltage level of the threshold voltage of MOS transistor or so is determined to be L level and a signal at the output power supply voltage VDDQ level. Thus, even when the input signal to the inverter of the latch circuit is increased in voltage level upon interruption of the external power supply voltage, the input signal to the inverter is kept at L level to maintain the output circuit in an output high impedance state with reliability.

Fourth Embodiment

Figure 7:
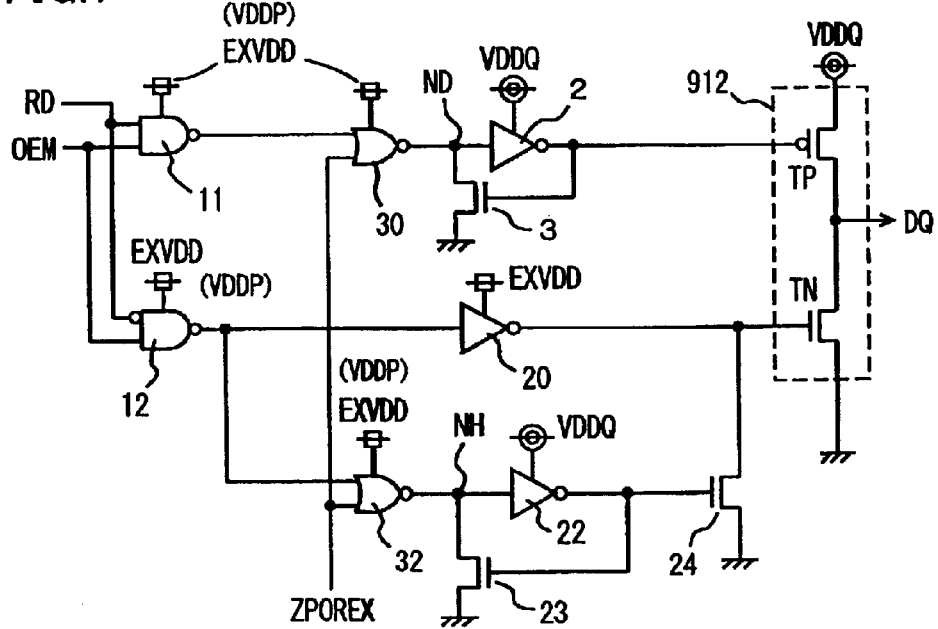
FIG. 7 schematically shows a configuration of the output circuit according to a fourth embodiment of the present invention.

FIG. 7 shows a configuration of the output circuit according to a fourth embodiment of the present invention. In the configuration shown in FIG. 7, external power supply voltage EXVDD is used as an operating power supply voltage for operating an internal circuit.

Referring to FIG. 7, the output circuit of FIG. 7 is different from the output circuit of FIG. 4 in the following construction. Inverter circuit 13 receiving a signal output from NAND circuit 11 is replaced with an NOR circuit 30 receiving an external power supply voltage power-on detection signal ZPOREX and a signal output from NAND gate 11. NOR circuit 30 outputs a signal applied to inverter circuit 2 forming the latch circuit. Furthermore, inverter circuit 21 receiving a signal output from gate circuit 12 is replaced with an NOR circuit 32 receiving the signal ZPOREX and a signal output from gate circuit 12. NOR circuit 32 outputs a signal applied to inverter circuit 22 forming the latch circuit. The remaining configuration of the output circuit of FIG. 7 is identical to that of the output circuit of FIG. 4, and like components are denoted by like reference numerals and the description thereof will not be repeated.

Power-on detection signal ZPOREX maintains the same voltage level as external power supply voltage VDDEX until external power supply voltage EXVDD stabilizes. When external power supply voltage EXVDD stabilizes, the power-on detection signal ZPOREX is set to L level. When external power supply voltage EXVDD is powered on, NOR circuits 30 and 32 determine that the power-on detection signal ZPOREX is at H level, and they can output signals set to L level and the output signals of the NOR circuits are prevented from turning into an uncertain state. When external power supply voltage EXVDD is stabilized, the power-on detection signal ZPOREX attains L level and NOR circuits 30 and 32 operate as an inverter circuit.

When external power supply voltage EXVDD is powered on, output power supply voltage VDDQ is supplied and inverter circuit 2 and MOS transistor 3 in cooperation can hold the node ND at the ground voltage level. Similarly, inverter circuit 22 and MOS transistor 23 in cooperation can hold the node NH at the ground voltage level. When external power supply voltage EXVDD is powered up, NOR circuits 30 and 32 also output signals held at L level until the power-on detection signal ZPOREX attains L level. Thus, when external power supply voltage EXVDD is powered up, NOR circuits 30 and 32 can be prevented from outputting signals in an uncertain state to adversely affect the output signals of inverter circuits 20 and 22.

Thus, when external power supply voltage EXVDD is powered up to again access the semiconductor memory device after the external power supply voltage is shut off, the output circuit can be prevented from entering a state different from an output high impedance state to adversely affect data/a signal on an external bus.

Figure 8:
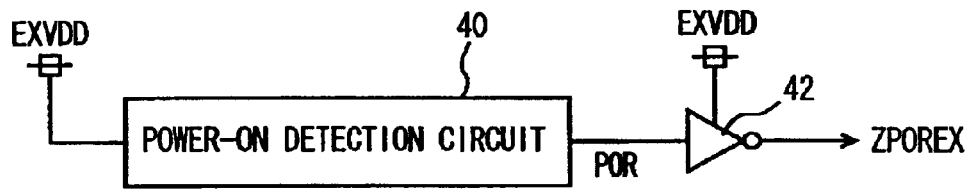
FIG. 8 schematically shows a configuration of a portion for generating a power-on detection signal shown in FIG. 7.

FIG. 8 shows by way of example a configuration of a portion generating an external power supply voltage power-on detection signal. As shown in FIG. 8, the external power-on detection portion includes a power-on detection unit 40 for detecting the power up of external power supply voltage EXVDD, and an inverter circuit 42 inverting the power-on detection signal POR output from external power-on detection circuit 40. Inverter circuit 402 receives external power supply voltage EXVDD as an operating power supply voltage, and receive and inverts the external power-on detection signal output from external power-on detection circuit 40 to generate an external power supply voltage power-on detection signal ZPOREX indicating that the external power supply voltage is powered up.

Figure 9:
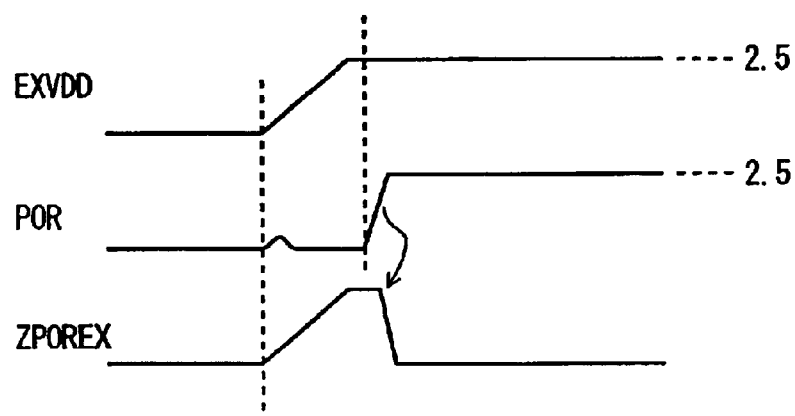
FIG. 9 is a signal waveform diagram representing an operation of a power-on detection portion shown in FIG. 8.

FIG. 9 is a signal waveform diagram representing an operation of the power-on detection portion shown in FIG. 8. Now, referring to FIG. 9, description is given of an operation of the external power-on detection portion shown in FIG. 8.

When external power supply voltage EXVDD is powered up, its voltage level slowly increases, depending on the load of an external power supply line. Power-on detection circuit 40 has a well known configuration, and the output signal of the power-on detection circuit 40 is slightly increased in voltage level as the rise of the external power supply voltage upon power up of the external power supply voltage, and is immediately driven to L level of the ground voltage level by an internal circuit (inverter).

While power-on detection circuit 40 outputs signal POR at L level, inverter circuit 42 increases the voltage level of signal ZPOREX in accordance with the voltage level of external power supply voltage EXVDD.

When external power supply voltage EXVDD attains a prescribed voltage level or stabilizes, power-on detection circuit 40 raises the external power supply voltage power-on detection signal POR to H level and inverter circuit 42 in response outputs the external power supply voltage power-on detection signal ZPOREX at L level.

Wen external power supply voltage EXVDD is powered up and the external power supply voltage power-on detection signal ZPOREX exceeds a threshold voltage of n-channel MOS transistors included in NOR circuits 30 and 32, NOR circuits 30 and 32 output the signals reliably held at L level. Upon power up, NOR circuits 30 and 32 output the signals reliably fixed to L level, and do not adversely affect the latch signal voltage by a latch circuit formed of an inverter circuit and a MOS transistor.

It should be noted that in the above description, external power supply voltage EXVDD is used as an operating power supply voltage for a peripheral circuit. However, peripheral power supply voltage VDDP generated by down-converting external power supply voltage EXVDD may be used as an operating power supply voltage for the peripheral circuit. In this configuration, as shown in parenthesis in FIG. 7, the circuits excluding inverter circuit 20 receive as an operating power supply voltage the peripheral power supply voltage VDDP in place of the external power supply voltage. If peripheral power supply voltage VDDP is used as an operating power supply voltage for the peripheral circuit, a peripheral power supply voltage power-on detection signal detecting that peripheral power supply voltage VDDP is powered up may be employed in place of the external power supply voltage power-on detection signal ZPOREX.

As described so far, according to the fourth embodiment, a gate circuit, which is arranged at a preceding stage of a latch circuit and receives as an operating power supply voltage a voltage corresponding to an external power supply voltage, receives a power supply voltage power-on detection signal. Thus, the output signal of the gate circuit can be held at a predetermined voltage level upon power up of the external power supply voltage, and therefore, the adverse affect to the latching operation of the latch circuit upon power up of the external power supply voltage is reliably prevented. Consequently, the output circuit is reliably set in the output high impedance state upon restoring of the external power supply voltage.

In the above, the description is given of an operation upon reinstating of power up while output power supply voltage VDDQ is being supplied. However, also upon power-on, such as a system resetting, in a power up sequence in which output power supply voltage VDDQ is first powered up and then the external power supply voltage EXVDD is powered up, the output circuit can reliably be initialized to the output high impedance state, to prevent an erroneous operation of the entire system and an erroneous initialization of the semiconductor memory device.

Fifth Embodiment

Figure 10:
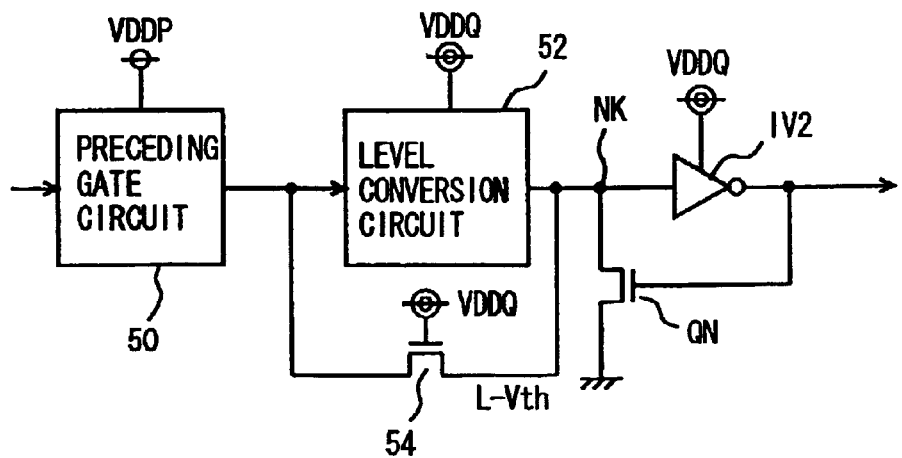
FIG. 10 schematically shows a configuration of a main portion of the output circuit according to a fifth embodiment of the present invention.
Figure 11:
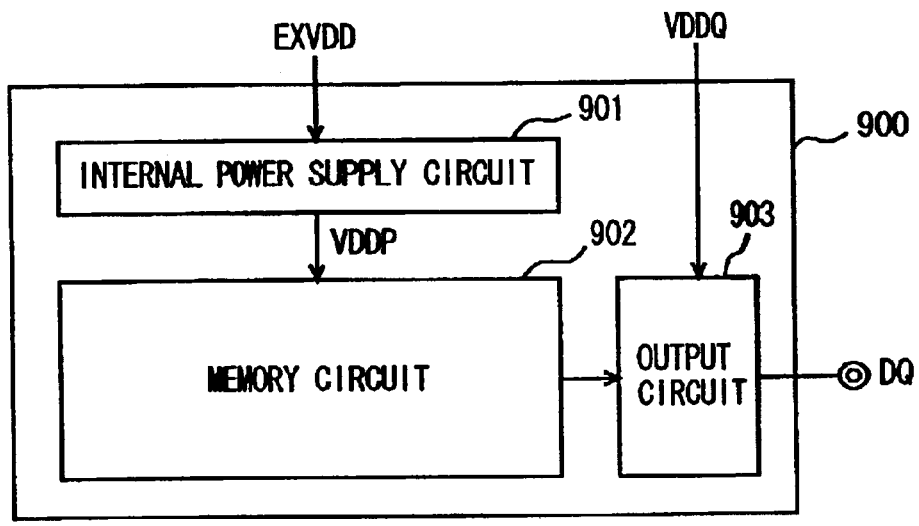
FIG. 11 schematically shows an entire configuration of a conventional semiconductor device.
Figure 12:
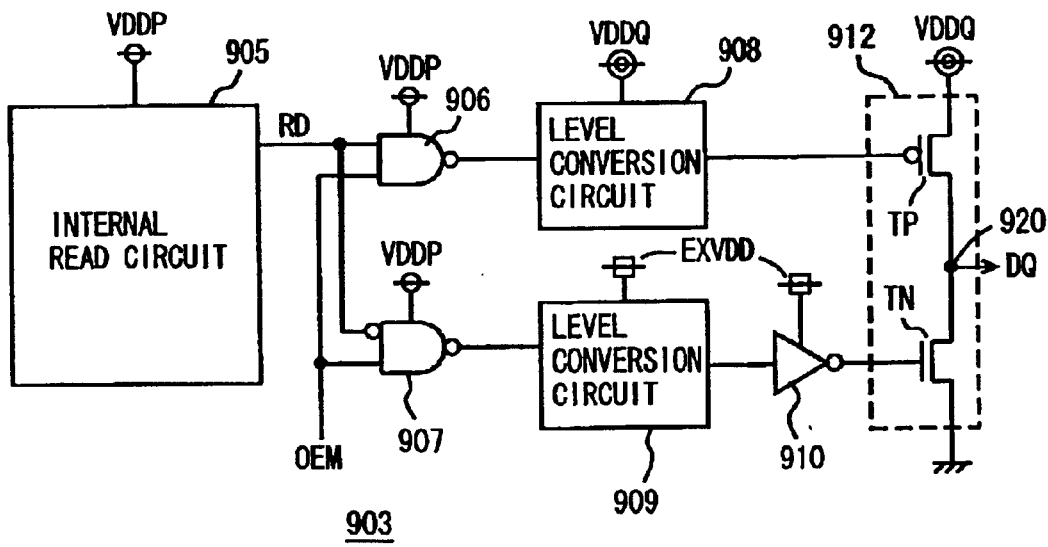
FIG. 12 schematically shows a configuration of the output circuit shown in FIG. 11.

FIG. 10 schematically shows a configuration of a main portion of the output circuit according to a fifth embodiment of the present invention. In FIG. 10, inverter circuit IV2 and n-channel MOS transistor QN in combination form a half latch (a latch circuit). The latch circuit formed by inverter circuit IV2 and MOS transistor QN may be any of the latch circuits of the first to fourth embodiments. The latch circuit is preceded in the arrangement by a level conversion circuit 52 converting an amplitude of an internal signal to the output power supply voltage FCCQ level. Level conversion circuit 52 converts the amplitude of a signal output from a preceding gate circuit 50 receiving internal power supply voltage (or peripheral power supply voltage) VDDP as an operating power supply voltage. In other words, an internal circuit receives an operating power supply voltage lower than output power supply voltage VDDQ. The configuration of level conversion circuit 52 is identical to that of the level conversion circuit shown in FIG. 13. Between an input node of level conversion circuit 52 and an output node of level conversion circuit 52, there is arranged a transfer gate 54 formed of an n-channel MOS transistor receiving at its gate output power supply voltage VDDQ.

Transfer gate 54 has a low threshold voltage Vthn and is a low threshold voltage transistor (L-Vth transistor). In a standby state, inverter circuit IV2 and MOS transistor QN in cooperation hold an output node NK of level conversion circuit 52 at the ground voltage level.

In this state, even if supplying of external power supply voltage EXVDD is shut off to drop the voltage level of peripheral power supply voltage VDDP in response for causing an output signal of the preceding gate circuit 50 to turn into an uncertain voltage level, transfer gate 54 can transfer the voltage of output node NK of level conversion circuit 52 (the ground voltage level) to the output node of the preceding gate circuit 50 (or the input node of level conversion circuit 52). Thus, in the level conversion circuit shown in FIG. 13, where the node NB corresponds to output node NK of level conversion circuit 52, if the preceding gate circuit 50 outputs a signal (SIN) in an uncertain state, MOS transistors 908b and 908c turn unstable to change the internal nodes (NA and NB) towards a voltage level of an intermediate level, the output node NK of level conversion circuit 52 is set to the ground voltage level by means of inverter circuit IV1 and MOS transistor QN to suppress the voltage increase at the internal node of the level conversion circuit 52.

Figure 13:
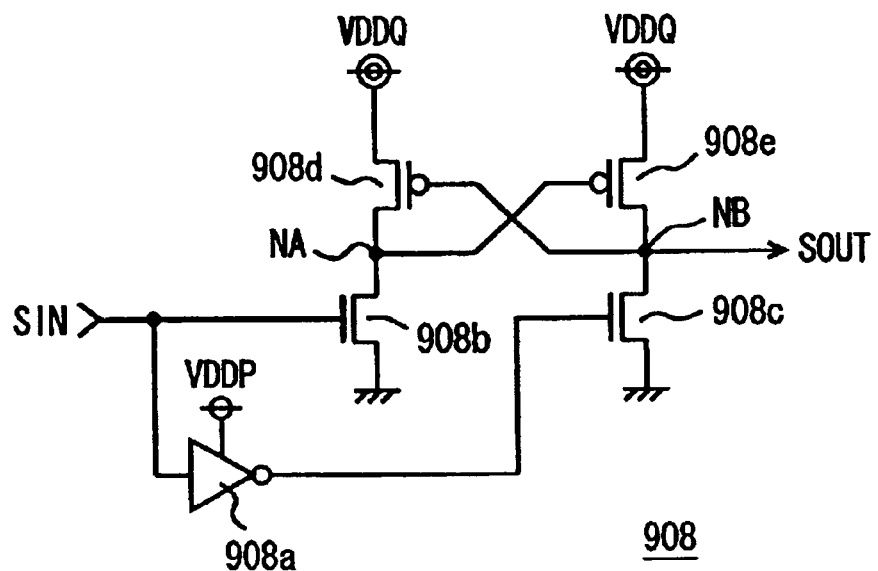
FIG. 13 shows an exemplary configuration of the level conversion circuit shown in FIG. 12.
Figure 14:
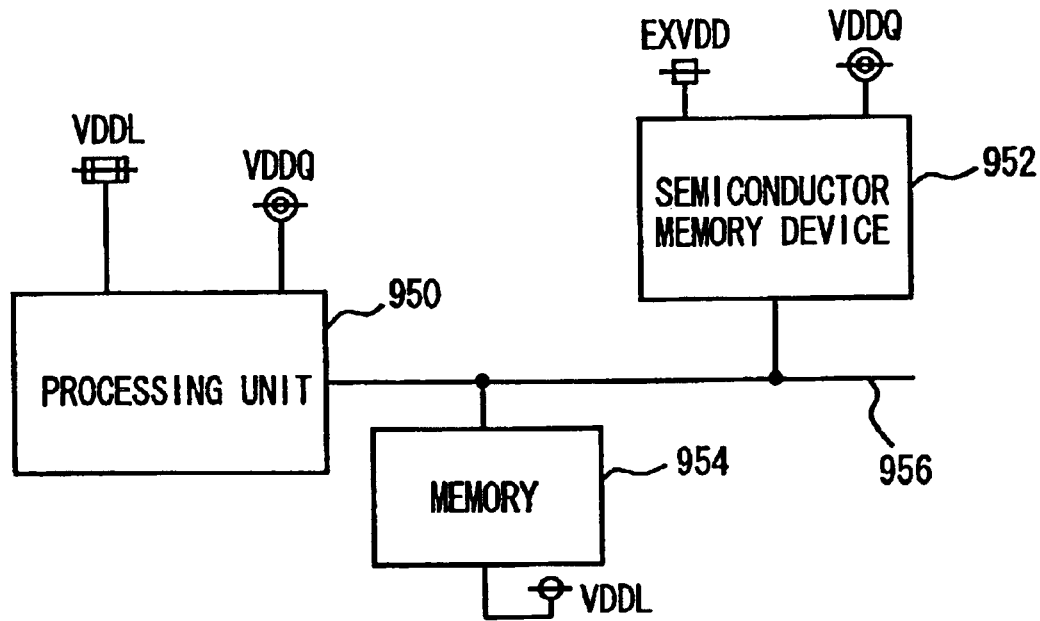
FIG. 14 schematically shows a configuration of a conventional data processing system.

Furthermore, if there is a possibility that the internal node NA shown in FIG. 13 attains an intermediate voltage level, transfer gate 54 serves to hold the signal SIN shown in FIG. 13 to the ground voltage level to reliably set the MOS transistor 908b shown in FIG. 13 in a non-conductive state. Thus, internal node NA can be held at the output power supply voltage VDDQ level to reliably maintain level conversion circuit 52 in a latching state, and thus through current can be prevented from flowing. Furthermore, level conversion circuit 52 can also be prevented from outputting a signal floating up in voltage level to an intermediate level, to prevent inverter IV2 from flowing a through-current.

Thus, also when an internal circuit operates receiving an operating power supply voltage provided by peripheral power supply voltage VDDP lower in level than output power supply voltage VDDQ and level conversion circuit 52 is also provided a latch circuit configured of inverter circuit IV2 and MOS transistor QN ensures that when supplying the external power supply voltage (or the peripheral power supply voltage) is interrupted, level conversion circuit 52 can be prevented from outputting a signal uncertain in state, and thus ensures that the output buffer circuit can be set to have a high output impedance state.

Furthermore, transfer gate 54 can prevent the preceding gate circuit 50 from outputting a signal of an uncertain state.

In the above description, description is given of an operation effected when the external power supply voltage is shut off. However, the present invention also ensures that when the external power supply voltage is re-powered up, level conversion circuit 52 can have its input and output nodes held at voltage levels of the standby state.

The configuration shown in FIG. 10 is applicable to the configuration in which peripheral power supply voltage is generated through down conversion of the external power supply voltage and is used as an operating power supply voltage for the peripheral circuitry in the configurations of the first to fourth embodiments.

Other Configuration

In the first to fifth embodiments, a latch circuit formed of an inverter circuit and a MOS transistor is configured to hold an input node at the ground voltage level. However, an inverter circuit and a p-channel MOS transistor may be used to form the latch circuit holding an input node at the output power supply voltage level. In this case, the number of inverter stages needs to be adjusted to allow the output buffer circuit to have p- and n-channel MOS transistors TP and TN both rendered non-conductive.

Furthermore, while in the above, description is given of configurations of an output circuit of semiconductor memory devices, the present invention is applicable to general semiconductor memory devices with an internal circuit using an operating power supply voltage related to an external power supply voltage and an output buffer circuit using an exclusively supplied power supply voltage.

Thus, according to the present invention, in a semiconductor memory device receiving an output power supply voltage for use in an output circuit and an external power supply voltage to be used by an internal circuit, a latch circuit is arranged at a subsequent stage of the circuit using as the operating power supply voltage dependent on the external power supply voltage and is configured to receive the output power supply voltage as the operating power supply voltage. Thus, an internal node is kept in a standby state to set the output circuit in an output high impedance state even when the external power supply voltage is interrupted while the output power supply voltage is being powered up.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
    first output drive signal generation circuitry receiving a first power supply voltage as an operating power supply voltage thereof; responsive at least to an internal signal for generating a first output drive signal;
    a first latch circuit, receiving a second power supply voltage applied independently of the first power supply voltage as an operating power supply voltage thereof;

for latching selectively and transferring said first output drive signal; and a first output transistor, receiving said second power supply voltage as an operating power supply voltage thereof, responsive to a signal outputted from said first latch circuit for driving a main output node, said first latch circuit latching the first output drive signal to control the first output transistor to be non-conductive when the first output drive signal attains a level not higher than a predetermined voltage level.

2. The semiconductor device according to claim 1, further comprising:

second output drive signal generation circuitry, receiving said first power supply voltage as an operating power supply voltage thereof, responsive at least to said internal signal for generating a second output drive signal;

a second latch circuit, receiving said second power supply voltage as an operating power supply voltage thereof, for latching and transferring said second output drive signal; and output drive circuitry for driving said main output node in response at least to a signal outputted from said second latch circuit, said output drive circuitry, upon driving said main output node, for driving said main output node in accordance with said internal signal, complementarily to said first output transistor.

3. The semiconductor device according to claim 2, wherein said output drive circuitry includes:

a buffer circuit, receiving said second power supply voltage as an operating power supply voltage thereof, for buffering said output signal of said second latch circuit; and a second output transistor selectively rendered conductive in response to a signal output from said buffer circuit, for driving said main output node to a voltage level different in polarity from said second power supply voltage when rendered conductive.

4. The semiconductor device according to claim 2, wherein said output drive circuitry includes:

an auxiliary drive circuit, receiving said first power supply voltage as an operating power supply voltage thereof, for generating a signal the same in logical level with said second output drive signal in accordance with said internal signal;

an auxiliary transistor responsive to a signal output from said second latch circuit for selectively coupling an output node of said auxiliary drive circuit with a reference voltage node supplying a voltage different in polarity from said second power supply voltage; and a second output transistor selectively rendered conductive in accordance with a voltage at the output node of said auxiliary drive circuit, for driving said main output node to a level of the voltage at said reference voltage node.

5. The semiconductor device according to claim 2, wherein said second latch circuit includes an inverter having an input logical threshold voltage set to a level, higher than said first power supply voltage, making at least said second output drive signal generation circuitry non-operative.

6. The semiconductor device according to claim 2, further comprising a power-on detection circuit for detecting power on of said first power supply voltage, to generate a power-on detection signal upon power on of said first power supply voltage, wherein said second output drive signal generation circuitry generates said second output drive signal in accordance with said internal signal and said power-on detection signal.

7. The semiconductor device according to claim 2, further comprising:

a level conversion circuit arranged between said second output drive signal generation circuitry and said second latch circuit receiving a signal output from said second output drive signal generation circuitry, for converting in amplitude a received signal to a level of said second power supply voltage for transmission to said second latch circuit; and a transfer gate coupled between an input of said level conversion circuit and an output of said level conversion circuit and receiving said second power supply voltage at a gate thereof.

8. The semiconductor device according to claim 1, wherein said first latch circuit includes an inverter having an input logical threshold voltage set to a level, higher than the first power supply voltage, making at least said first output drive signal generation circuitry non-operative.

9. The semiconductor device according to claim 1, further comprising a power-on detection circuit for detecting power on of said first power supply voltage, to generate a power-on detection signal, wherein said first output drive signal generation circuitry generates said first output drive signal in accordance with said power-on detection signal and said internal signal.

10. The semiconductor device according to claim 1, further comprising:

a level conversion circuit, arranged between said first output drive signal generation circuitry and said first latch circuit and receiving a signal output from said first output drive signal generation circuitry, for converting in amplitude a received signal to a level of said second power supply voltage for transmission to said first latch circuit; and a transfer gate coupled between an input of said level conversion circuit and an output of said level conversion circuit and receiving said second power supply voltage at a gate thereof.

11. A semiconductor device comprising:

first circuitry receiving a first power supply voltage as an operating power supply voltage thereof and generating a first signal in accordance with a received signal; and second circuitry, receiving a second power supply voltage applied independently of said first power supply voltage as an operating power supply voltage thereof, receiving said first signal from said first circuitry for generating a second signal in accordance with said first signal, said second circuitry including a latch circuit receiving said first signal at an input and latching a signal voltage at said input when said first signal is at a predetermined voltage level, and an output driver responsive to an output signal transferred from sad latch circuit for generating said second signal, said latch circuit controlling said output driver to be non-conductive by latching said first signal when said first signal attains a level not higher than said predetermined voltage level.

* * * * *